United States Patent [19]

Moustakas et al.

[11] 4,417,092

[45] Nov. 22, 1983

[54] SPUTTERED PIN AMORPHOUS SILICON SEMI-CONDUCTOR DEVICE AND METHOD THEREFOR

[75] Inventors: Theodore D. Moustakas, Berkeley Heights; Robert A. Friedman, Milford, both of N.J.

[73] Assignee: Exxon Research and Engineering Co., Florham Park, N.J.

[21] Appl. No.: 243,754

[22] Filed: Mar. 16, 1981

[51] Int. Cl.$^3$ ...................... H01L 31/06; H01L 31/18
[52] U.S. Cl. ............................... 136/258; 204/192 S; 204/192 P; 357/2; 357/30
[58] Field of Search .................. 204/192 S, 192 P; 427/74, 86; 29/572; 136/258 AM; 357/2, 30 K

[56] References Cited

U.S. PATENT DOCUMENTS 4,064,521 12/1977 Carlson .................................. 357/2
4,251,289 2/1981 Moustakas et al. .................. 136/255

FOREIGN PATENT DOCUMENTS 55-82474 6/1980 Japan ........................... 136/258 AM

OTHER PUBLICATIONS

H. Okamoto et al., "Device Physics & Design of a-Si ITO/p-i-n Heteroface Solar Cells", *Solar Energy Mat'ls.*, vol. 2, pp. 313-325, (1980).
D. A. Anderson et al., "An Assessment of the Suitability of RF Sputtered Amorphous Hydrogenated Si as a Potential Solar Cell Material", *J. Electronic Mat'ls.*, vol. 9, pp. 141-152, (1980).
D. E. Carlson et al., "Amorphous Silicon Solar Cell", *Appl. Phys. Lett.*, vol. 28, pp. 671-673, (1976).
M. H. Brodsky et al., "Doping of Sputtered Amorphous Semiconductors", *IBM Tech. Disc. Bull.*, vol. 19, pp. 4802-4803, (1977).

*Primary Examiner*—Aaron Weisstuch
*Attorney, Agent, or Firm*—Ronald D. Hantman

[57] ABSTRACT

A high efficiency amorphous silicon PIN semi-conductor device is constructed by the sequential sputtering of N, I and P layers of amorphous silicon and at least one semi-transparent ohmic electrode. A method of construction produces a PIN device, exhibiting enhanced physical integrity and facilitates ease of construction in a singular vacuum system and vacuum pump down procedure.

18 Claims, 1 Drawing Figure

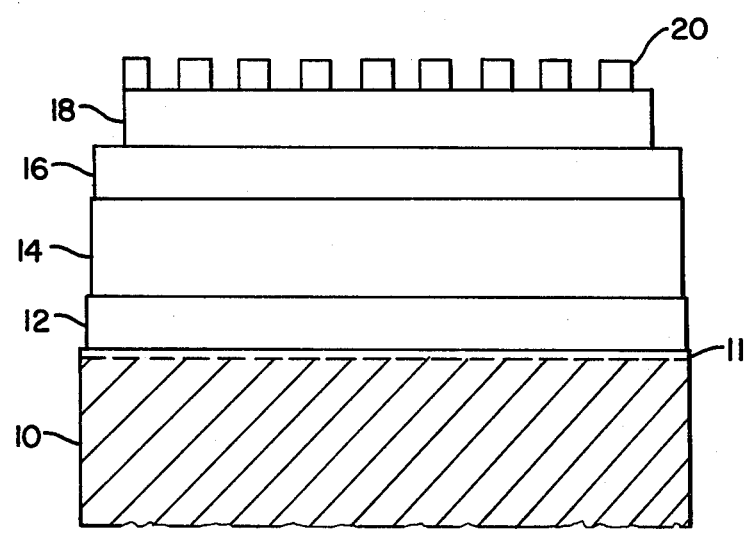

SPUTTERED PIN AMORPHOUS SILICON SEMI-CONDUCTOR DEVICE AND METHOD THEREFOR

BACKGROUND OF THE INVENTION

The present invention results from research performed under U.S. Government Contract No. XZ-0-9219 for the Solar Energy Research Institute.

FIELD OF THE INVENTION

The present invention relates to amorphous silicon and more particularly to a method for reactively sputtering a PIN amorphous silicon semiconductor device.

Hydrogenated amorphous silicon, a highly photoconductive semiconductor, is generally constructed in thin film form by one of two methods. Photoconductive amorphous silicon may be produced by glow discharge decomposition of silane using the plasma's energy to decompose the $SiH_4$ structure, depositing silicon in the presence of and incorporating therewith an amount of hydrogen. Numerous examples of the technique may be found in the art, one such illustration being U.S. Pat. No. 4,064,521. The ability to control the selective incorporation of the hydrogen into the depositing silicon is a principal deficiency in the glow decomposition technique.

A second method for producing hydrogenated amorphous silicon is reactive sputtering. Sputtering is a well developed technology having been used in the single crystal silicon semi-conductor field for roughly the past twenty years. Reactive sputtering of amorphous silicon permits more precise control over the amount of hydrogen incorporated into the deposited thin film.

Amorphous silicon is a promising candidate for solar cell application, having absorption characteristics which suitably complement solar insolation and efficiencies which are reasonably high. In thin film form, amorphous silicon further promises a substantial reduction in the cost of fabricating solar cells. The most successful solar cell configuration to date is the PIN structure. In a technical publication entitled "Factors Influencing the Efficiency of Amorphous Silicon Cells" by David E. Carlson, Journal of Non-Crystalline Solids, Vols. 35 and 36 (1980) 707–717, a PIN amorphous silicon solar cell having efficiency of about 4–6% was constructed using glow discharge decomposition of silane. Those of the art recognize that the deposition parameters strongly influence the optical and electrical characteristics of the resultant amorphous silicon. Controlling the deposition parameters is a necessary requisite to successful fabrication of amorphous silicon solar cell devices. The present invention is directed to a method for fabricating a PIN amorphous silicon device for substantially greater control of the numerous deposition parameters.

SUMMARY OF THE INVENTION

The invention is directed to a method for fabricating an amorphous silicon PIN semi-conductor device. An N+ layer is reactively sputtered from a silicon target in an atmosphere containing argon, hydrogen and phosphine. An intrinsic, I-layer, is also reactively sputtered in an atmosphere containing argon and hydrogen. The P+ layer, also reactively sputtered, is deposited in an atmosphere containing argon, hydrogen and diborane. The hydrogen partial pressure, which controls the optical and electronic properties of the films, can be chosen to be different during the deposition of the three layers. Thus, PIN devices whose different layers have different energy gaps can be produced. Electrodes or other contacts to the device are also sputter deposited, which permits the entire deposition to be accomplished in one sputtering apparatus and in one vacuum pump down. The method is also of advantage in producing films which are strongly adherent to both adjacent layers and to the underlying substrate.

BRIEF DESCRIPTION OF THE DRAWING

The single FIGURE accompanying the application is a greatly enlarged side view of a semi-conductor device constructed in accordance with the teachings of the present invention.

DETAILED DESCRIPTION OF THE INVENTION

The sputtered amorphous silicon PIN device of the present invention, as illustrated in the drawing, includes a substrate 10 which generally comprises a physically supportive substrate for the overlying sputter deposited layers. Substrate 10 includes a major area coating surface which is substantially free from voids or protrusions of the order (in size) of the thickness of the overlying layers to avoid pin holes therethrough.

In one embodiment, substrate 10 may comprise a non-electroconductive material such as glass or ceramic for which an overlying layer of an electroconductive material 11 is required. Alternately, substrate 10 may comprise a metal concurrently serving as a supportive substrate and an electrode contact to the overlying layers. In either instance, the coating surface of the substrate is thoroughly cleaned to remove unwanted contamination of the coating surface. In a preferred embodiment, electrode 10 comprises a metal known to form an ohmic contact to N+-doped silicon such as molybdenum niobium, tantalum, chromium, vanadium or stainless steel for example. In the case where substrate 10 comprises a nonelectroconductive material it is preferred that layer 11 comprise a layer of metal known to form an ohmic contact to N+-doped amorphous silicon such as molybdenum or chromium thin films, approximately 1,000 to 2,000 Å thick.

The substrates are fastened to the anode electrode of a conventional RF diode sputtering unit which is adapted to provide controlled partial pressures of hydrogen, argon, phosphine and diborane as detailed hereinafter. The term secured is intended in this application to mean both the physical securing of the substrate to the anode electrode and more importantly the electrical contacting of the conducting coating surface to the anode electrode. In this manner the coating surface is maintained at the approximate electrical potential of the anode electrode. The anode electrode is either electrically grounded or supplied with a positive or negative bias of approximately ±50 volts. The sputtering system is further adapted to provide for controlled temperature heating of the substrates. The deposition temperature as recited hereinafter is measured by a thermocouple embedded in the anode electrode. It is to be recognized that the temperatures recited hereinafter are measured accordingly and the actual temperature of the depositing film may differ.

The sputtering system is evacuated to a base pressure of about $1 \times 10^{-7}$ Torr by conventional mechanical and cold trapped diffusion pumping means. An N+-layer of hydrogenated amorphous silicon, 12, is sputter deposited by first heating substrate to a monitored temperature ranging from about 250° C. to about 400° C. A sputtering target comprising a polycrystalline silicon disc about 5" in diameter is secured to the cathode electrode which is located about 4.5 cm from the substrate platform (anode electrode). The sputtering atmosphere comprises a partial pressure of hydrogen ranging from about 0.5 mTorr to about 1.5 mTorr and argon ranging from about 3 mTorr to about 15 mTorr. To dope the hydrogenated amorphous silicon layer N+ an amount of phosphine (PH$_3$) is added to the partial pressures of hydrogen and argon. In one embodiment, the argon source contains 2,000 ppm of phosphine. The sputtering is accomplished at an RF power of about 100 to 200 watts resulting in an induced DC bias of about −1,200 to −2,000 volts relative to the electrically grounded substrate platform (anode). These conditions lead to deposition rates between 2 to 4 Å/sec. The sputter deposition continues for a time ranging from about 1 min. to about 3 mins., resulting in a thickness of N+-layer, 12, ranging from about 150 angstroms to about 500 angstroms. Alternatively, the N+ layer can be produced in a graded doping form extending 2,000 to 3,000 Å. This can be accomplished by progressively reducing the amount of PH$_3$ in the discharge. The substrate heating described heretofore continues throughout the deposition to maintain the monitored substrate temperature within the indicated range to maintain a proper level of hydrogenation of the depositing amorphous silicon.

An intrinsic layer of hydrogenated amorphous silicon 14 is sputter deposited in an atmosphere containing pure argon and hydrogen. In a preferred embodiment, subsequent to the deposition of the N+-layer, a liquid nitrogen trap is utilized to minimize the condensible impurities within the sputtering system. The sputtering atmosphere for depositing the intrinsic layer ranges from about 3 m Torr to about 15 mTorr of pure argon and from about 0.5 mTorr to about 1.0 mTorr of hydrogen. The RF power conditions, cathode and anode configuration, and substrate temperature are substantially identical to that described for the sputter deposition of the N+-layer. Under these conditions, a layer of intrinsic amorphous silicon ranging from about 0.5 microns to about 1.5 microns in thickness is deposited.

A P+-doped layer of hydrogenated amorphous silicon 16 is sputtered deposited from an atmosphere of argon and hydrogen by the addition of an amount of diborane. A sputtering atmosphere comprising argon and hydrogen having partial pressure ranging from about 3 mTorr to about 15 mTorr and about 0.5 mTorr to about 2.0 mTorr respectively, includes a level of diborane dopant sufficient to dope the amorphous silicon P-type. In one embodiment, the argon source contains about 2,000 ppm of diborane (B$_2$H$_6$). The sputtering power conditions, monitored substrate temperature ranges, and configuration of the anode and cathode electrodes are substantially identical to that described for the deposition of the N+ and I layers. The thickness of the P+ layer, as compared to the thickness of the intrinsic and N-doped layers is thin, ranging from about 50 to about 150 angstroms. As presently understood, the P-layer functions to increase the built-in potential of a photovoltaic device. A current collection electrode 18, comprises an electroconductive material which is semi-transparent in the spectral region ranging from about 3,500 angstroms to about 7,000 angstroms, which constitutes the principal absorption region of the underlying amorphous silicon film layers. Further, electrode 18 must form a substantially ohmic contact to the contiguous P+-doped amorphous silicon. In one embodiment, electrode 18 may comprise a semi-transparent conductive oxide such as indium tin oxide, tin oxide or cadmium stannate. In such embodiment, the thickness of the conductive oxide may be tailored to provide an anti-reflection coating to the underlying silicon amorphous silicon surface. In an alternate embodiment, electrode 18 may comprise a relatively thin metallic layer, also being semitransparent and forming an ohmic contact to P+-doped amorphous silicon.

To further assist in the collection of current generated by the photovoltaic device, a grid electrode 20 may be patterned on the surface of electrode 18. The electroconductive grid, generally configured to minimize the area coverage and concurrently minimize the series resistance of the photovoltaic cell, may be constructed by several alternate techniques well known in the art.

Those skilled in the art recognize that the use of a glass or other similarly transparent substrate 10, having an electroconductive layer 11 chosen from indium tin oxide, Mo, Nb, Ta, Cr, or V, permits illumination of the device through the substrate. Furthermore, the deposition sequence of P+ and N+ layers may be reversed to deposit a layer of P+ amorphous silicon onto an ITO coated substrate, having the intrinsic and N+ layers deposited thereupon.

It is to be recognized that the several layers comprising the photovoltaic device described heretofore, may be accomplished by sputtering techniques facilitating the construction of this device in a singular vacuum sputtering unit and in a singular vacuum pump down. It should further be recognized that the sputtering techniques used in the construction of a photovoltaic device of the present invention result in enhanced physical integrity and adherance of the deposited films. The method manifests in an ability to sputter deposit a layer of semi-transparent conductive oxides such as indium tin oxide onto a relatively thin P doped layer, 16, without deterioating the junction forming characteristics of the underlying amorphous silicon layers. Essentially the source illumination can be from the bottom side of the substrate (glass+ITO) or from the top N+ layer.

To further one skilled in the art in the practice of the present invention, the following example details a specific embodiment.

EXAMPLE

Substrates of stainless steel and molybdenum were selected as known to form ohmic contacts to n+-doped layers of amorphous silicon. The substrates were thoroughly cleaned and vapor degreased in isopropyl alcohol and fastened on the grounded anode of an RF diode sputtering unit. After the system was evacuated to a base pressure, better than or equal to $1 \times 10^{-7}$ Torr, the substrates temperature was raised to 275° C. During sputtering, the target was supplied with an RF power of about 150 Watts, resulting in an induced dc bias of 1,500 Volts. Sputtering was accomplished in a partial pressure of hydrogen of 1 mTorr and argon 5 mTorr. The argon gas supply cylinder contained 2,000 ppm of PH$_3$. The deposition of this layer lasted for 2 min., resulting in a thickness of about 300 Å. The conductivity of this layer was measured to be about $10^{-2}$ ohm$^{-1}$ cm$^{-1}$ and its optical gap to be about 1.8 ev. After the deposition of the n+ layer, a Meisner liquid nitrogen trap, located inside the sputtering unit was filled with liquid nitrogen in order to minimize condensable impurities such as water or hydrocarbons. The i-layer (approximately 1.2 $\mu$m) was deposited under substantially the same power conditions as the n+-layer in an atmosphere of 5 mTorr of argon and 0.8 mTorr of hydrogen. The dark conductivity of the layer was determined to be about $10^{-8}$ ohm$^{-1}$ cm$^{-1}$ and, under AMI illumination, about $10^{-4}$ ohm$^{-1}$ cm$^{-1}$. The optical gap of this layer was about 1.8 ev. The p+-layer was sputter deposited for approximately one min. (thickness about 150 Å) under substantially identical power conditions as layer n+ and i in an atmosphere of 5 mTorr of Ar and 1.0 to 1.5 mTorr of hydrogen. The conductivity of this layer was about $10^{-3}$ ohm$^{-1}$ cm$^{-1}$ and the optical gap about 1.8 to 1.9 eV. An indium tin oxide thin film was deposited by sputtering on the top of the p+-layer from a sputtering target 5" in diameter and having a composition of In$_2$O$_3$/9 M% SnO$_2$. The target was supplied with an RF power of 50 Watts which resulted in a deposition rate of 40 Å/min. The target was conditioned by presputtering in an atmosphere of 8 mTorr of argon and 2 mTorr of oxygen. The ITO deposition on the top of the p+-layer was accomplished by sputtering in 10 mTorr of pure argon for approximately 13-15 min. (thickness 500-600 Å). The substrates during this deposition were held at 250° C. This heat treatment facilitated the annealing of damage induced during the sputtering. The resultant ITO films had a sheet resistance of about 50 Ohms/□, (ohms per square) and transmission of about 90%. This layer was found to form an antireflecting coating to the underlying amorphous silicon layers. Tested under simulated AM-1 illumination, the cells exhibited an open circuit voltage of between 0.8 to 0.9 volts, short circuit currents of about 8 m A/cm$^2$ to 10 m A/cm$^2$ and appropriate fill factors to produce an efficiency in excess of about three percent.

What is claimed is:

1. A method for producing an hydrogenated amorphous silicon PIN semi-conductor photovoltaic device having an improved open circuit voltage comprising the steps of:
   providing a substrate having at least a surface region comprising an electroconductive material which forms an ohmic contact to n+ amorphous silicon;
   reactively sputtering a layer of n+-doped hydrogenated amorphous silicon onto at least said surface region of the substrate;
   reactively sputtering a layer of intrinsic hydrogenated amorphous silicon onto said n+ layer;
   reactively sputtering a layer of P+-doped hydrogenated amorphous silicon onto said intrinsic layer in partial pressures of hydrogen, ranging from about $5 \times 10^{-4}$ Torr to about $2 \times 10^{-3}$ Torr, and argon, ranging from about $3 \times 10^{-3}$ Torr to about $1.5 \times 10^{-2}$ Torr, said argon containing diborane, B$_2$H$_6$; and
   sputtering an electroconductive material onto at least a top surface region of said P+-doped amorphous silicon, which material forms an ohmic contact thereto, whereupon irradiating with air mass one illumination said device exhibits a conversion efficiency in excess of about three percent and further wherein said substrates are maintained during said sputtering steps at a temperature ranging from about 250° C. to about 400° C.

2. The method of claim 1 wherein said substrate is selected from the group consisting of Mo, Nb, Ta, Cr or V.

3. The method of claim 1 wherein said substrate comprises glass having an electroconductive coating selected from the group consisting of indium tin oxide, Mo, Nb, Ta, Cr or V.

4. The method of claim 1 wherein said reactive sputtering of n+ doped amorphous silicon comprises sputtering amorphous silicon in partial pressures of hydrogen, ranging from about $5 \times 10^{-4}$ Torr to about $1.5 \times 10^{-3}$ Torr, and argon ranging from about $3 \times 10^{-3}$ Torr to about $1.5 \times 10^{-2}$ Torr, said partial pressure of argon including about 2,000 ppm of phosphine (PH$_3$).

5. The method of claim 4 wherein said amorphous silicon is sputtered from a polycrystalline silicon target.

6. The method of claim 5 wherein said target is about five inches in diameter and located a distance of about 4.5 cm from said substrates.

7. The method of claim 6 wherein an RF sputtering power of about 150 watts is coupled to the plasma, resulting in a target dc voltage of about $-1,500$ volts.

8. The method of claim 1 wherein said n+ layer ranges in thickness from about 150 to about 3,000 Angstroms.

9. The method of claim 1 wherein said n+ layer comprises a gradual doping level of phosphine through the thickness of the n+ layer.

10. The method of claim 1 wherein said reactive sputtering of the intrinsic, I, layer of amorphous silicon comprises sputtering amorphous silicon in partial pressures of hydrogen, ranging from about $5 \times 10^{-4}$ Torr to about $1.0 \times 10^{-3}$ Torr, and argon, ranging from about $3 \times 10^{-3}$ Torr to about $1.5 \times 10^{-2}$ Torr.

11. The method of claim 10 wherein said intrinsic layer ranges in thickness from about 0.5 to about 1.5 $\mu$M.

12. The method of claim 11 wherein an RF sputtering power of about 150 watts is used to sputter said amorphous silicon from a target which is about five inches in diameter and located a distance of about 4.5 cm from said substrates.

13. The method of claim 1 wherein said p+ layer ranges in thickness from about 50 to about 150 Angstroms.

14. The method of claim 13 wherein said p+ layer is about 100 Å in thickness.

15. The method of claim 1 wherein said electroconductive material, sputtered onto said p+ doped amorphous silicon is a thin film of material selected from the group consisting of indium tin oxide, tin oxide or cadmium stannate.

16. The method of claim 15 wherein said electroconductive material is a thin film of indium tin oxide.

17. A reactively sputtered hydrogenated amorphous silicon PIN photovoltaic device having increased photo-conversion efficiency and longevity, said device comprising:
   a substrate having at least a surface region of which comprises an electronconductive material which forms an ohmic contact to n+ doped amorphous silicon;
   a reactively sputtered layer of n+-doped hydrogenated amorphous silicon deposited on at least said ohmic contact;
   a layer of intrinsic hydrogenated amorphous silicon, reactively sputtered onto said n+ layer;

a layer of p+-doped hydrogenated amorphous silicon ranging in thickness from about 50 to about 150 Angstroms, reactively sputtered onto said intrinsic layer in partial pressures of hydrogen, ranging from about $5 \times 10^{-4}$ Torr to about $2 \times 10^{-3}$ Torr, and argon, ranging from about $3 \times 10^{-3}$ Torr to about $1.5 \times 10^{-2}$ Torr, said argon containing diborane, $B_2H_6$; and a layer of electroconductive material forming an ohmic contact to said layer of p+doped amorphous silicon, sputter deposited onto at least a portion of said p+-doped layer, said sputtered layers being strongly adherent to contiguous layers and said substrate, said device having a sunlight conversion efficiency in excess of about three percent and further wherein said substrates are maintained during the sputtering of said layers at a temperature ranging from about 250° C. to about 400° C.

18. The photovoltaic device of claim 17 wherein said P+doped layer is about 150 Angstroms in thickness.

* * * * *